United States Patent
Adam et al.

(10) Patent No.: US 8,866,227 B2
(45) Date of Patent: Oct. 21, 2014

(54) THIN SEMICONDUCTOR-ON-INSULATOR MOSFET WITH CO-INTEGRATED SILICON, SILICON GERMANIUM AND SILICON DOPED WITH CARBON CHANNELS

(75) Inventors: Thomas N. Adam, Slingerlands, NY (US); Stephen W. Bedell, Wappingers Falls, NY (US); Kangguo Cheng, Schenectady, NY (US); Bruce B. Doris, Brewster, NY (US); Ali Khakifirooz, Mountain View, CA (US); Alexander Reznicek, Mount Kisco, NY (US); Devendra K. Sadana, Pleasantville, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 222 days.

(21) Appl. No.: 13/607,743

(22) Filed: Sep. 9, 2012

(65) Prior Publication Data

US 2013/0099319 A1    Apr. 25, 2013

Related U.S. Application Data

(63) Continuation of application No. 13/280,850, filed on Oct. 25, 2011, now abandoned.

(51) Int. Cl.

| | |
|---|---|
| *H01L 27/12* | (2006.01) |
| *H01L 21/84* | (2006.01) |
| *H01L 21/77* | (2006.01) |
| *H01L 27/092* | (2006.01) |
| *H01L 21/02* | (2006.01) |
| *H01L 21/8234* | (2006.01) |

(52) U.S. Cl.
CPC ........... *H01L 21/84* (2013.01); *H01L 21/02573* (2013.01); *H01L 21/0262* (2013.01); *H01L 21/77* (2013.01); *H01L 27/092* (2013.01); *H01L 21/02532* (2013.01); *H01L 21/823412* (2013.01)
USPC .............. 257/351; 257/E21.09; 257/E27.112; 438/492

(58) Field of Classification Search
CPC ........ H01L 21/84; H01L 21/77; H01L 27/092
USPC .............. 257/351, E21.09, E27.112; 438/492
See application file for complete search history.

(56) References Cited

U.S. PATENT DOCUMENTS

| | | |
|---|---|---|
| 6,774,409 B2 | 8/2004 | Baba et al. |
| 7,268,049 B2 | 9/2007 | Zhu et al. |

(Continued)

OTHER PUBLICATIONS

M.H. Lee et al., "The role of carbon on performance of strained-Si:C surface channel NMOSFETs," Solid-State Electronics, vol. 52, Issue 10, Oct. 2008, pp. 1569-1572.

(Continued)

*Primary Examiner* — Stephen W Smoot
*Assistant Examiner* — Vicki B Booker
(74) *Attorney, Agent, or Firm* — Scully, Scott, Murphy & Presser, P.C.; Louis J. Percello, Esq.

(57) ABSTRACT

A method of fabricating a semiconductor device that may begin with providing a semiconductor substrate including a first device region including a silicon layer in direct contact with a buried dielectric layer, a second device region including a silicon germanium layer in direct contact with the buried dielectric layer, and a third device region with a silicon doped with carbon layer. At least one low power semiconductor device may then be formed on the silicon layer within the first device region of the semiconductor substrate. At least one p-type semiconductor device may be formed on the silicon germanium layer of the second device region of the semiconductor substrate. At least one n-type semiconductor device may be formed on the silicon doped with carbon layer of the third device region of the semiconductor substrate.

5 Claims, 5 Drawing Sheets

(56) References Cited

U.S. PATENT DOCUMENTS

| | | |
|---|---|---|
| 7,303,949 B2 | 12/2007 | Chen et al. |
| 7,348,248 B2 | 3/2008 | Cheng |
| 7,439,594 B2 | 10/2008 | Mouli |
| 7,482,656 B2 | 1/2009 | Luo et al. |
| 7,906,381 B2 | 3/2011 | Loubet et al. |
| 8,110,483 B2 | 2/2012 | Abadeer et al. |
| 2011/0042744 A1 | 2/2011 | Cheng et al. |

OTHER PUBLICATIONS

M. Jurzak et al., "SON (Silicon on Nothing)—A New Device Architecture for the ULSI ERA." Symposium on VLSI Technology, pp. 29-30 Jun. 1999.

Notice of Allowance dated Feb. 3, 2014 received in U.S. Appl. No. 13/280,850.

THIN SEMICONDUCTOR-ON-INSULATOR MOSFET WITH CO-INTEGRATED SILICON, SILICON GERMANIUM AND SILICON DOPED WITH CARBON CHANNELS

CROSS REFERENCE TO RELATED APPLICATION

This application is a continuation of U.S. patent application Ser. No. 13/280,850, filed Oct. 25, 2011, the entire content and disclosure of which is incorporated herein by reference.

BACKGROUND

The present disclosure relates generally to semiconductor devices. More particularly, the present disclosure relates to scaling of semiconductor devices.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties.

SUMMARY

In one aspect, a method of forming a semiconductor substrate is provided, in which a single substrate includes regions of silicon (Si), silicon germanium (SiGe), and silicon doped with carbon (Si:C) to provide a channel of semiconductor devices formed thereon. The method may begin with providing a semiconductor on insulator (SOI) substrate comprising a silicon layer overlying a buried insulating layer. The SOI layer may then be etched to provide at least a first device region, a second device region and a third device region, wherein the etch process removes a portion of the silicon layer separating the first device region, the second device region and the third device region. A first block mask may then be formed on the first device region, and a silicon germanium layer may be formed on at least a portion of the silicon layer in at least one of the second device region and the third device region. Germanium (Ge) from the silicon germanium layer may then be diffused from the silicon germanium layer into the silicon layer in at least one of the second device region and the third device region. One of the second device region and the third device region in which the germanium from the silicon germanium layer is diffused into the silicon layer is then covered with a second block mask. A silicon doped with carbon layer is then formed on an exposed silicon germanium layer of the second device region and the third device region that is not covered with the second block mask.

In another aspect, a method of fabricating a semiconductor device is provided in which channel regions composed of silicon, silicon germanium, and silicon doped with carbon are integrated into a single semiconductor substrate. In one embodiment, the method may include providing a semiconductor substrate including a first device region including a silicon layer in direct contact with a buried dielectric layer, a second device region including a silicon germanium layer in direct contact with the buried dielectric layer, and a third device region with a silicon doped with carbon layer. At least one low power semiconductor device including a first n-type semiconductor device and a first p-type semiconductor device may then be formed on the silicon layer within the first device region of the semiconductor substrate. A second p-type semiconductor device may then be formed on the silicon germanium layer of the second device region of the semiconductor substrate. The second p-type semiconductor device on the silicon germanium layer of the second device region may have a threshold voltage ranging from 0.05 V to 0.5 V smaller than the first p-type semiconductor device formed on the silicon layer in the first device region. An n-type semiconductor device may then be formed on the silicon doped with carbon layer of the third device region of the semiconductor substrate. The second n-type semiconductor device on the silicon doped with carbon layer of the third device region may have a threshold voltage ranging from 0.05 V to 0.3 V smaller than the first n-type semiconductor device formed on the silicon layer in the first device region.

In yet another aspect, a semiconductor device is provided that includes a semiconductor substrate including a first device region including a silicon layer in direct contact with a buried dielectric layer, a second device region including a silicon germanium layer in direct contact with the buried dielectric layer, and a third device region with a silicon doped with carbon layer. At least one low power semiconductor device including a first n-type semi conductor device and a first p type semiconductor device is present on the silicon layer within the first device region of the semiconductor substrate. A second p-type semiconductor device is present on the silicon germanium layer of the second device region of the semiconductor substrate, wherein the second p-type semiconductor device has a threshold voltage ranging from 0.05 V to 0.5 V smaller than the first p-type semiconductor device formed on the silicon layer in the first device region. A second n-type semiconductor device may then be formed on the silicon doped with carbon layer of the third device region of the semiconductor substrate, wherein the second n-type semiconductor device has a threshold voltage ranging from 0.05 V to 0.3 V smaller than the first n-type semiconductor device formed on the Si layer in the first device region.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
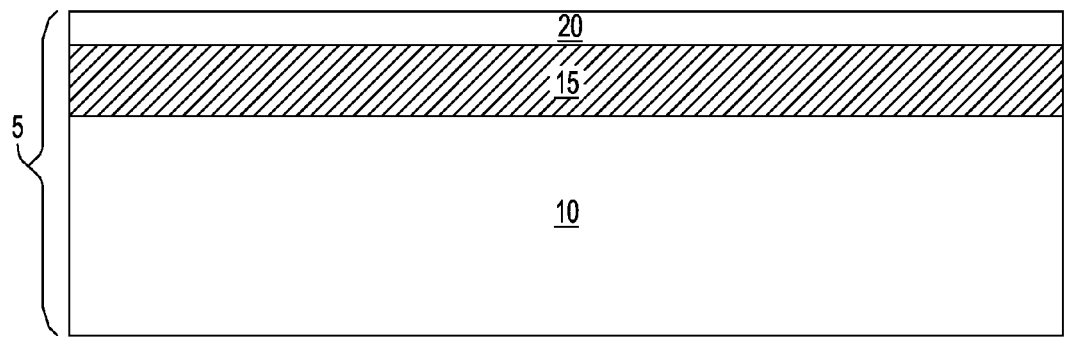
FIG. 1 is a side cross-sectional view depicting providing a substrate comprising at least a silicon layer atop a buried dielectric layer, in accordance with one embodiment of the present disclosure.

Detailed embodiments of the present disclosure are described herein; however, it is to be understood that the disclosed embodiments are merely illustrative of the methods and structures that may be embodied in various forms. In addition, each of the examples given in connection with the various embodiments of the disclosure is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on", "present on" or "positioned atop" means that a first element, such as a first structure, is present on a second element, such as a second structure, wherein intervening elements, such as an interface structure, e.g. interface layer, may be present between the first element and the second element.

The term "direct contact" means that a first element, such as a first structure, and a second element, such as a second structure, are connected without any intermediary conducting, insulating or semiconductor layers at the interface of the two elements.

It has been determined that most strain-engineering methods are inapplicable in semiconductor devices formed on extremely thin semiconductor on insulator (ETSOI) layers. An extremely thin semiconductor on insulator (ETSOI) layer is a semiconductor layer having a thickness that is 10 nm or less that is present atop a buried dielectric layer of a semiconductor on insulator (SOI) substrate. For example, it has been determined that embedded stress inducing wells that are typically used to enhance hole and electron transport in field effect transistors (FETs) that are formed on bulk substrates cannot be employed in ETSOI layers. Further, strain transferred from the stress inducing liners to the channel of FETs formed on ETSOI layers may be negligible due to the presence of raised source/drain structures. Further, both embedded stress inducing wells in source and drain regions, and stress inducing liner methods lose their effectiveness as the gate pitch is reduced for technology scaling.

Additionally, threshold voltage adjustment for high performance and low power devices is also problematic for FETs formed on ETSOI layers. As used herein, "threshold voltage (Vt)" is the lowest attainable gate voltage that will turn on a semiconductor device, e.g., FET, by making the channel region of the device conductive. Gate workfunction engineering is one method for threshold voltage (Vt) adjustment in undoped channel devices. However, the material availability is limited for providing low threshold voltage p-type field effect transistors (pFETs). Channel regions composed of silicon germanium have been proposed to lower the pFET threshold voltage. However, since the total channel thickness should be limited, e.g., to a total thickness of 10 nm or smaller, in devices formed on ETSOI layers in order to control short channel effects, conventional silicon germanium/silicon channels cannot be formed stop a silicon layer.

In some embodiments, the methods and structures disclosed herein provide a hybrid semiconductor structure that includes silicon, silicon germanium, and silicon doped with carbon channel technology that may overcome the aforementioned challenges for forming semiconductor devices on ETSOI layers. As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

In some embodiments, low power FETs are fabricated with a channel region composed of silicon in a first device region of the substrate, and high performance pFETs and high performance nFETs are fabricated with channel regions composed of SiGe and Si:C channels, respectively. A "field effect transistor (FET)" is a transistor in which output current, i.e., source-drain current, is controlled by the voltage applied to the gate. A FET has three terminals, i.e., gate structure, source region and drain region. A "gate structure" means a structure used to control output current (i.e., flow of carriers in the channel) of a semiconducting device through electrical or magnetic fields. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel. As used herein, the term "channel" is the region underlying the gate structure and between the source region and drain region of a semiconductor device that becomes conductive when the semiconductor device is turned on.

A semiconductor device, e.g., FET, that is characterized as being "low power" is a semiconductor device that has an off current, i.e. source-drain current when gate voltage is equal to zero and the drain voltage is equal to the nominal supply voltage, that is less than about 10 nA/μm. In some embodiments, the off current of a low power FET is less then about 1 nA/μm. A semiconductor device, e.g., FET, that is characterized as being "high performance" is a semiconductor device that has an off-current higher than about 10 nA/μm. It should be noted that the definition of the low-power and high-performance semiconductor devices may depend on the application for the devices. Typically, a low-power FET has a threshold voltage higher than about 0.3 V, while a high-performance FET has a threshold voltage less than about 0.3 V. For example, a high performance nFET may have a threshold voltage ranging from 0.15 V to 0.25 V and a high performance pFET may have a threshold voltage ranging from 0.35 V to 0.45 V.

FIGS. 1-10 depict one embodiment of a semiconductor structure, and a method of forming thereof, that provides multiple threshold voltages that are required for co-integration of high performance and low power semiconductor devices, and offers a pitch independent method to incorporate tensile and compressive strain into high performance nFETs and pFETs, respectively.

FIG. 1 depicts one embodiment of a substrate 5 including at least a silicon layer 20 atop a buried dielectric layer 15. A base semiconductor layer 10 may be present underlying the dielectric layer 15. In some embodiments, the silicon layer 20 may have a base material that is greater than 99% silicon. The base material is the composition of a material layer prior to doping to provide a semiconductor device, e.g., prior to source and drain doping. In another embodiment, the silicon layer 20 may have a base material that is 100% silicon. In some embodiments, the silicon layer 20 of the substrate 5 may be thinned to a thickness of an ETSOI layer by planarization, grinding, wet etch, dry etch, oxidation followed by oxide etch, or any combination thereof. One method of thinning the silicon layer 20 is to oxidize the silicon by a thermal dry or wet oxidation process, and then wet etch the oxide layer using a hydrofluoric acid mixture. This process can be repeated to achieve the desired thickness. In one embodiment, the silicon layer 20 has a thickness ranging from 1.0 nm to 10.0 nm. In another embodiment, the silicon layer 20 has a thickness ranging from 1.0 nm to 5.0 nm. In a further embodiment, the silicon layer 20 has a thickness ranging from 3.0 nm to 8.0 nm. The base semiconductor layer 10 may be a semiconducting material including, but not limited to Si, strained Si, SiC, SiGe, SiGeC, Si alloys, Ge, Ge alloys, GaAs, InAs, InP as well as other III/V and II/VI compound semiconductors.

The buried dielectric layer 15 that may be present underlying the silicon layer 20 and atop the base semiconductor layer 10 may be formed by implanting a high-energy dopant into the substrate 5 and then annealing the structure. In another embodiment, the buried dielectric layer 15 may be deposited or grown prior to the formation of the silicon layer 20. In yet another embodiment, the substrate 5 may be formed using wafer-bonding techniques, where a bonded wafer pair is formed utilizing glue, adhesive polymer, or direct bonding. In yet another embodiment, the base semiconductor layer 10 may be a bulk semiconductor substrate, wherein the buried dielectric layer 15 and the silicon layer 20 may be deposited on the base semiconductor layer 10.

Figure 2:
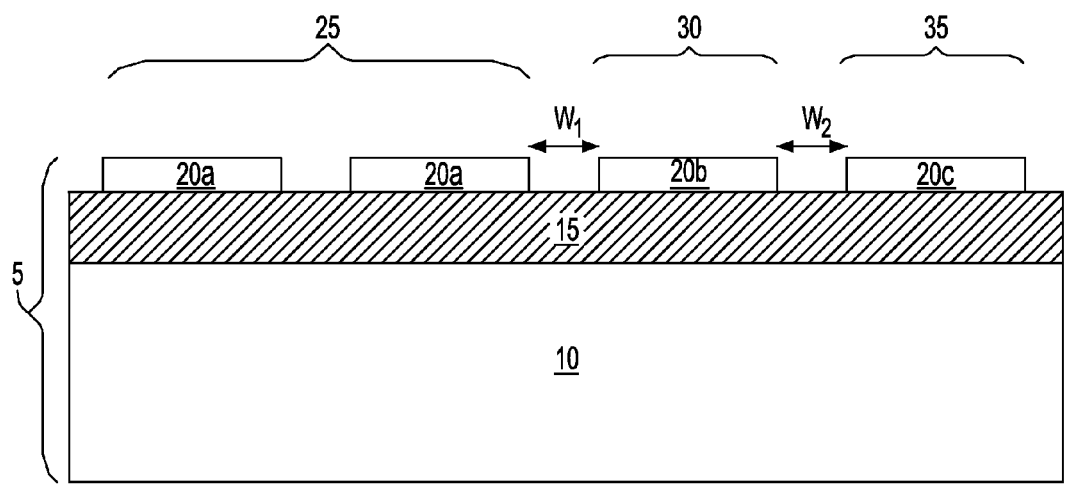
FIG. 2 is a side cross-sectional view depicting etching the silicon layer to provide at least a first device region, a second device region and a third device region in the substrate, in accordance with one embodiment of the present disclosure.

FIG. 2 depicts etching the silicon layer 20 to provide at least a first device region 25, a second device region 30 and a third device region 35 in the substrate 5. The etch process typically removes a portion of the silicon layer between the first device region 25 and the second device region 30, and removes a portion of the silicon layer that is between the second region 30 and the third region 35. In one embodiment, following etching a first remaining portion 20a of the silicon layer is present in the first device region 25, a second remaining portion 20b of the silicon layer is present in the second device region 25, and a third remaining portion 20c of the silicon layer is present in the third device region 35.

In one embodiment, etching the silicon layer may include forming an etch mask (not shown) overlying the silicon layer, in which the portions of the silicon layer exposed by the etch mask are removed by an etch process that is selective to the buried dielectric layer 15. Specifically, an etch mask is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied. In some examples, the selectivity may be greater than 100:1.

In one embodiment, the etch process removes the exposed portions of the silicon layer with an etch chemistry that is selective to the buried dielectric layer 15. In one embodiment, the etch process that removes the portions of the silicon layer between the first device region 25, the second device region 30 and the third device region 35 is an anisotropic etch process. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

In one embodiment, the width W1 of the portion of the silicon layer that is removed from between the first device region 25 and the second device region 30 ranges from 10 nm to 1000 nm. In another embodiment, the width W1 of the portion of the silicon layer that is removed from between the first device region 25 and the second device region 30 ranges from 10 nm to 100 nm. In some embodiments, the width W2 of the portion of the silicon layer that is removed between the second device region 30 and the third device region 35 is equal to the width W1 of the portion of the silicon layer that is removed from between the first device region 25 and the second device region 30. The above dimensions for the width W1 separating the first device region 25 from the second device region 30, and the width W2 separating the second device region 30 from the third device region 35 is provided for illustrative purposes only and is not intended to limit the present disclosure.

Figure 3:
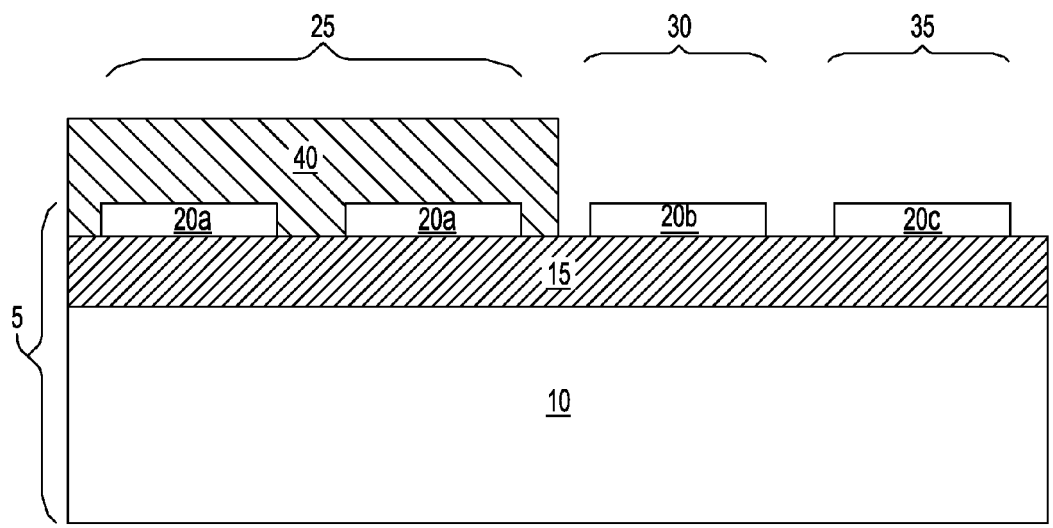
FIG. 3 is a side cross-sectional view depicting forming a first block mask on the first device region, in accordance with one embodiment of the present disclosure.

FIG. 3 depicts one embodiment of forming a first block mask 40 on the first device region 25 of the substrate 5. In one embodiment, the first block mask 40 is formed protecting the portion of the substrate 5 in which the low power semiconductor devices, e.g., FETS, are subsequently formed. In some embodiments, the exposed portion of the substrate that is not protected by the block mask 25 is subsequently processed to provide the high performance p-type semiconductor devices, e.g., pFET, and high performance n-type semiconductor devices, e.g., nFET.

The first block mask 40 may comprise soft and/or hardmask materials and can be formed using deposition, photolithography and etching. In one embodiment, the first block mask 40 is a hardmask composed of a nitride containing material, such as silicon nitride. It is noted that it is not intended that the first block mask 40 be limited to only silicon nitride, as the composition of the first block mask 40 may include any dielectric material that may be deposited on the substrate 5. Other hardmask compositions for the first block mask 40 may include silicon oxides, silicon oxynitrides, silicon carbides, silicon carbonitrides, etc. Spin-on dielectrics may also be utilized as a hardmask material including, but not limited to: silsequioxanes, siloxanes, and boron phosphate silicate glass (BPSG).

In one embodiment, a first block mask 40 comprising a hardmask material may be formed by blanket depositing a layer of hardmask material, providing a patterned photoresist atop the layer of hardmask material, and then etching the layer of hardmask material to provide a first block mask 40 protecting at least the first device region 25 of the substrate 5. The pattern and etch steps for forming the first block mask 40 are similar to the pattern and etch steps employed to etch the silicon layer in defining the first device region 25, second device region 30 and the third device region 35 of the substrate, as described above with reference to FIG. 2.

Figure 4:
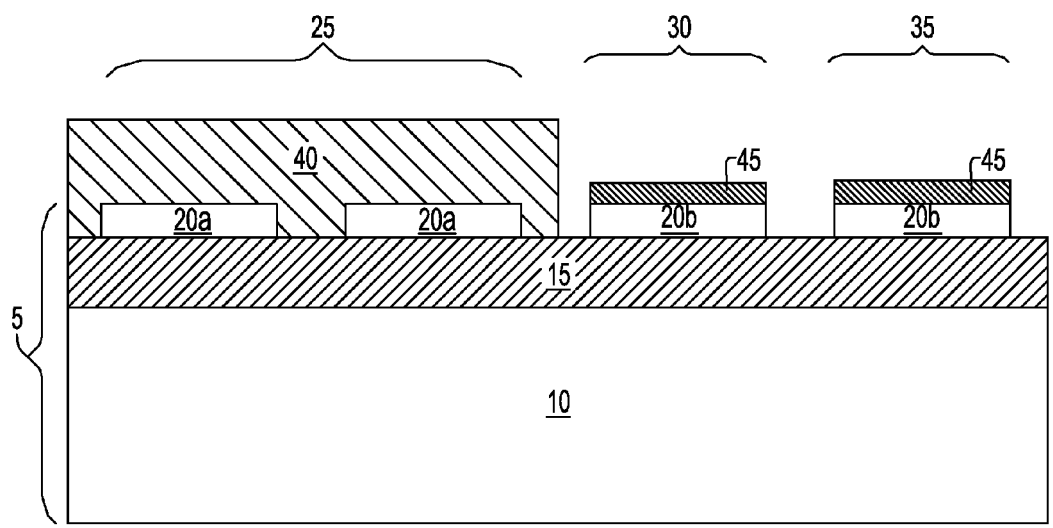
FIG. 4 is a side cross-sectional view depicting forming a silicon germanium layer on at least a portion of the silicon layer in at least one of the second device region and the third device region, in accordance with one embodiment of the present disclosure.

FIG. 4 depicts one embodiment of forming a silicon germanium layer 45 on one of the second and third remaining portions 20b, 20c in at least one of the second device region 30 and the third device region 35. In one embodiment, the silicon germanium layer 45 is formed using an epitaxial growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the surface of the remaining portion 20b, 20c of the silicon layer with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, possibly the result of implanting, the depositing atoms have no surface to align to, resulting in the formation of polysilicon instead of single crystal silicon. The first block mask 40 obstructs the silicon germanium layer 45 from being formed on the first portion 20a of the silicon layer that is present in the first device region 25. In some embodiments, epitaxial growth of silicon germanium may be preferential, wherein the silicon germanium is not formed on dielectrics or amorphous materials. In some examples, in which amorphous silicon germanium is epitaxially formed on an amorphous surface, the amorphous silicon germanium may be removed by selective etching.

A number of different sources may be used for the deposition of epitaxial silicon germanium (SiGe). In some embodiments, the gas source for the deposition of epitaxial SiGe may include a mixture of silicon containing gas sources and germanium containing gas sources. For example, an epitaxial layer of silicon germanium may be deposited from the combination of a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and a germanium gas source that is selected from the group consisting of germane, digermane, halogermane, dichlorogermane, trichlorogermane, tetrachlorogermane and combinations thereof. The germanium content of the epitaxial layer of silicon germanium may range from 5% to 70%, by atomic weight %. In another embodiment, the germanium content of the epitaxial layer of silicon germanium may range from 10% to 40%. The temperature for epitaxial silicon germanium deposition typically ranges from 550° C. to 900° C. Although higher temperature typically results in faster deposition, the faster deposition may result in crystal defects and film cracking. The thickness of the silicon germanium layer 45 may range from 3 nm to 20 nm. In another embodiment, the thickness of the silicon germanium layer 45 may range from 3 nm to 10 nm.

The epitaxial grown silicon germanium layer 45 may be under an intrinsic compressive strain, in which the compressive strain is produced by a lattice mismatch between the larger lattice dimension of the silicon germanium and the smaller lattice dimension of the layer on which the silicon germanium is epitaxially grown, e.g., the second and third portions 20b, 20c of the silicon layer. In one embodiment, the epitaxial grown silicon germanium produces a compressive strain, in which the channel of a semiconductor device, such as a pFET device, is subsequently formed.

Figure 5:
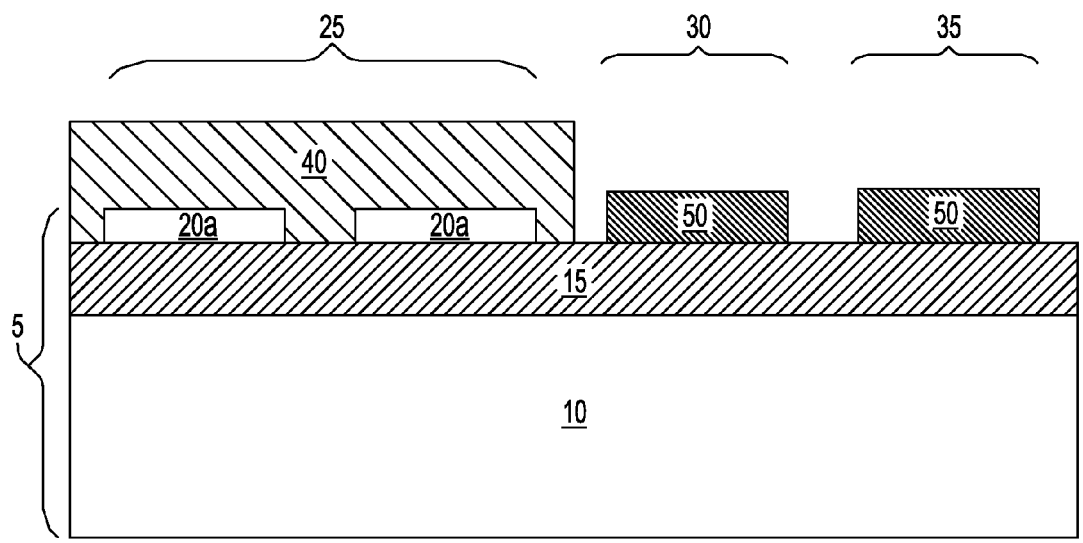
FIG. 5 is a side cross-sectional view depicting diffusing germanium from the silicon germanium layer into the silicon layer in at least one of the second device region and the third device region, in accordance with one embodiment of the present disclosure.

FIG. 5 depicts diffusing germanium from the silicon germanium layer into the silicon layer in at least one of the second device region 30 and the third device region 35, wherein the diffusion of the germanium into the silicon layer converts the silicon layer and the silicon germanium layer into a single material layer of silicon germanium 50. The lower surface of the single material layer of silicon germanium 50 may be in direct contact with the upper surface of the buried dielectric layer 15. The single material layer of the silicon germanium 50 may have a germanium content ranging from 5 wt. % to 30 wt %. In another embodiment, the single material layer of the silicon germanium 50 may have a germanium content ranging from 5 wt. % to 15 wt %.

In another embodiment, the diffusion of the germanium atoms is performed in an oxygen-containing atmosphere. In this case, silicon atoms from the silicon germanium layer are preferentially oxidized. The single material layer of the silicon germanium 50 may have a germanium content ranging from 5 wt. % to 60 wt. %. In another embodiment, the single material layer of the silicon germanium 50 may have a germanium content ranging from 5 wt. % to 30 wt. %.

The thickness of the single material layer of the silicon germanium 50 may range from 3 nm to 20 nm. In another embodiment, the thickness of the single material layer of the silicon germanium 50 may range from 3 nm to 10 nm. In yet another embodiment, the silicon germanium layer is thinned to the desired thickness by etching process. For example, wet etching using a solution that contains hydrogen peroxide for example a solution that contains hydrogen peroxide and ammonium hydroxide can be used to etch the silicon germanium layer to the desired thickness. Alternatively, gaseous hydrogen chloride (HCl) chemistry can be used to etch the silicon germanium layer to the desired thickness. In one embodiment, the diffusing of the germanium from the silicon germanium layer into the silicon layer comprise annealing, such as rapid thermal annealing (RTA), flash lamp annealing, furnace annealing, laser annealing and combinations thereof. In one embodiment, the annealing may include a temperature ranging from 800° C. to 1200° C., and a time period ranging from 1 second to 90 minutes.

Typically, the intrinsic stress that is formed in the silicon germanium layer prior to diffusion of the germanium into the underlying silicon layer is maintained in the single material layer of the silicon germanium 50. For example, in one embodiment, the intrinsic compressive stress of the single material layer of silicon germanium 50 may range from 300 MPa to 4 GPa. In another embodiment, the intrinsic compressive stress in the single material layer of the silicon germanium 50 may range from 300 MPa to 2 GPa.

Figure 6:
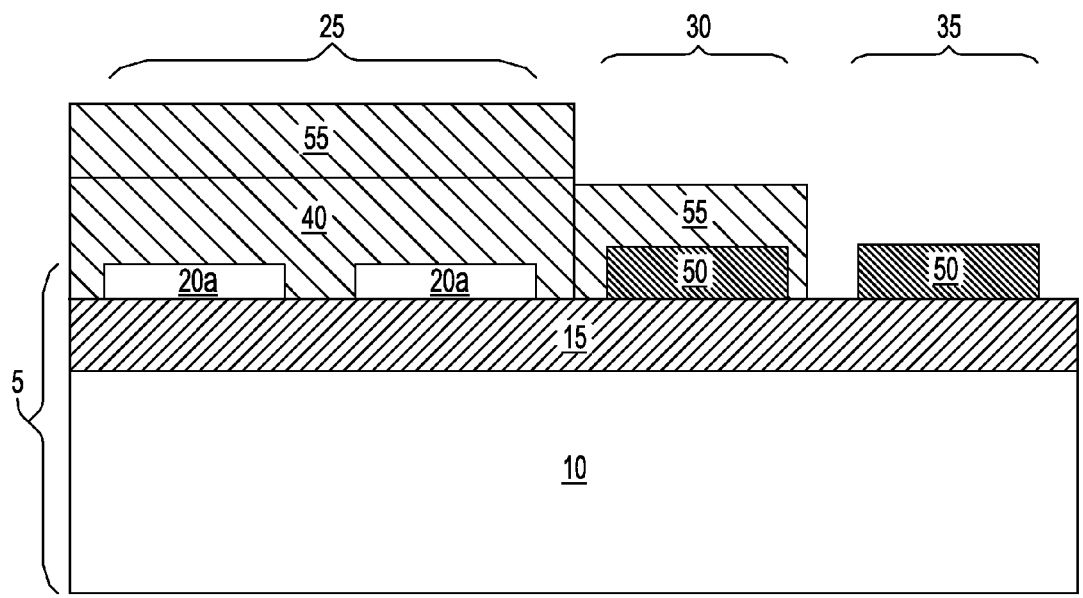
FIG. 6 is a cross-sectional view depicting forming a second block mask over one of the second device region and the third device region in which the germanium from the silicon germanium layer has diffused into the silicon layer, in accordance with one embodiment of the present disclosure.

FIG. 6 depicts one embodiment of forming a second block mask 55 over the first device region 25 and the second device region 30, in which the third device region 35 remains exposed. The second block mask 55 that is depicted in FIG. 6 is similar to the first block mask 40 that is described above with reference to FIG. 3. Therefore, the description of the first block mask 40 that is depicted being formed in FIG. 3 is suitable for the second block mask 55 that is depicted being formed in FIG. 6.

Figure 7:
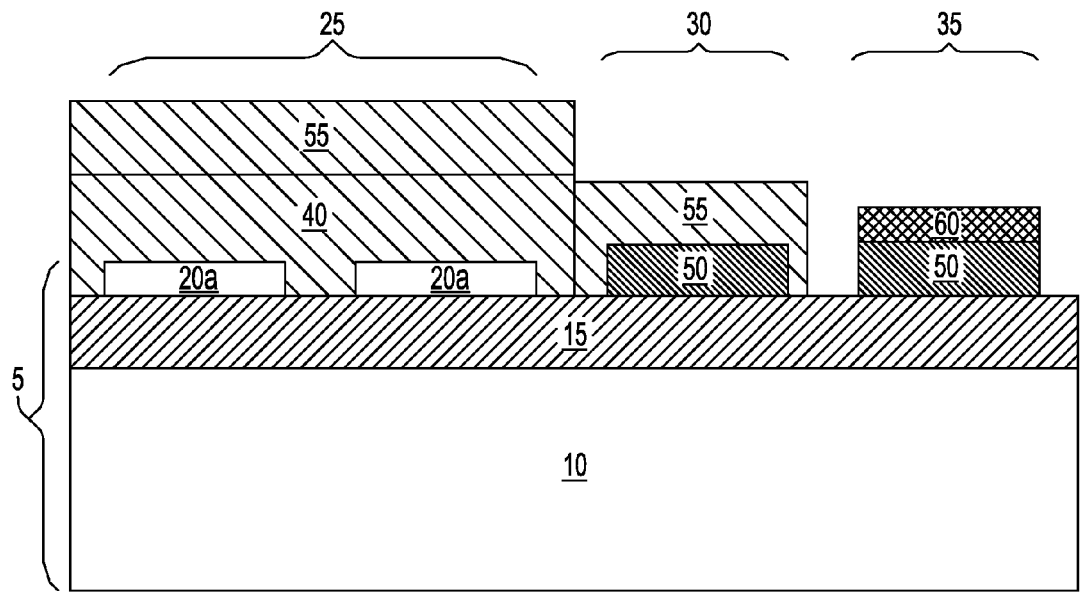
FIG. 7 is a side cross-sectional view depicting forming a silicon doped with carbon layer on an exposed silicon germanium layer that is not covered with the second block mask, in accordance with one embodiment of the present disclosure.

FIG. 7 depicts forming a silicon doped with carbon layer 60 on the exposed single material layer of the silicon germanium 50 that is not covered with the second block mask 55. The term "Si:C" or "silicon doped with carbon" as used herein refers to silicon having substitutional carbon atoms located therein. The substitutional carbon atoms and the silicon atoms form a silicon-carbon alloy, which is a semiconductor material. In one embodiment, the silicon doped with carbon layer 60 is formed using an epitaxial growth process. The second block mask 55 obstructs the silicon doped with carbon layer 60 from being formed on the single material layer of the silicon germanium 50 that is present in the second device region 30, and the first block mask 40 obstructs the silicon doped with carbon layer 60 from being formed on the silicon layer 20a that is present in the first device region 25.

A number of different sources may be used for the deposition of silicon doped with carbon layer 60. In some embodiments, the silicon containing gas sources for epitaxial growth include silane ($SiH_4$), disilane ($Si_2H_6$), trisilane ($Si_3H_8$), tetrasilane ($Si_4H_{10}$), hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2$$SiH_2$), ethylsilane (($CH_3CH_2$)$SiH_3$), methyldisilane (($CH_3$)$Si_2H_5$), dimethyldisilane (($CH_3$)$_2$$Si_2H_4$), hexamethyldisilane (($CH_3$)$_6$$Si_2$) and combinations thereof. The carbon may be introduced to the epitaxial silicon by ion implantation. In another embodiment, the epitaxially grown silicon may be in-situ doped using a carbon containing gas.

The carbon (C) content of the epitaxial grown silicon doped with carbon may range from 0.3% to 5%, by atomic weight %. In another embodiment, the carbon content of the epitaxial grown silicon doped with carbon may range from 1% to 2%. The temperature for epitaxial silicon deposition typically ranges from 550° C. to 900° C. Although higher temperature typically results in faster deposition, the faster deposition may result in crystal defects and film cracking. The thickness of the silicon doped with carbon layer 60 may range from 3 nm to 20 nm. In another embodiment, the thickness of the silicon doped with carbon layer 60 may range from 3 nm to 10 nm.

The silicon doped with carbon layer 60 may be under an intrinsic tensile strain, in which the tensile strain is produced by a lattice mismatch between the smaller lattice dimension of the silicon doped with carbon 60 and the larger lattice dimension of the layer on which the silicon doped with carbon layer 60 is epitaxially grown, e.g., the single material layer of silicon germanium 50. In one embodiment, the epitaxial grown silicon doped with carbon layer 60 produces a tensile strain, in which the channel of a semiconductor device, such as an nFET device, is subsequently formed. For example, in one embodiment, the intrinsic tensile stress in the silicon doped with carbon layer 60 may range from 200 MPa to 2 GPa. In another embodiment, the intrinsic tensile stress in the silicon doped with carbon layer 60 may range from 200 MPa to 1 GPa.

Figure 8:
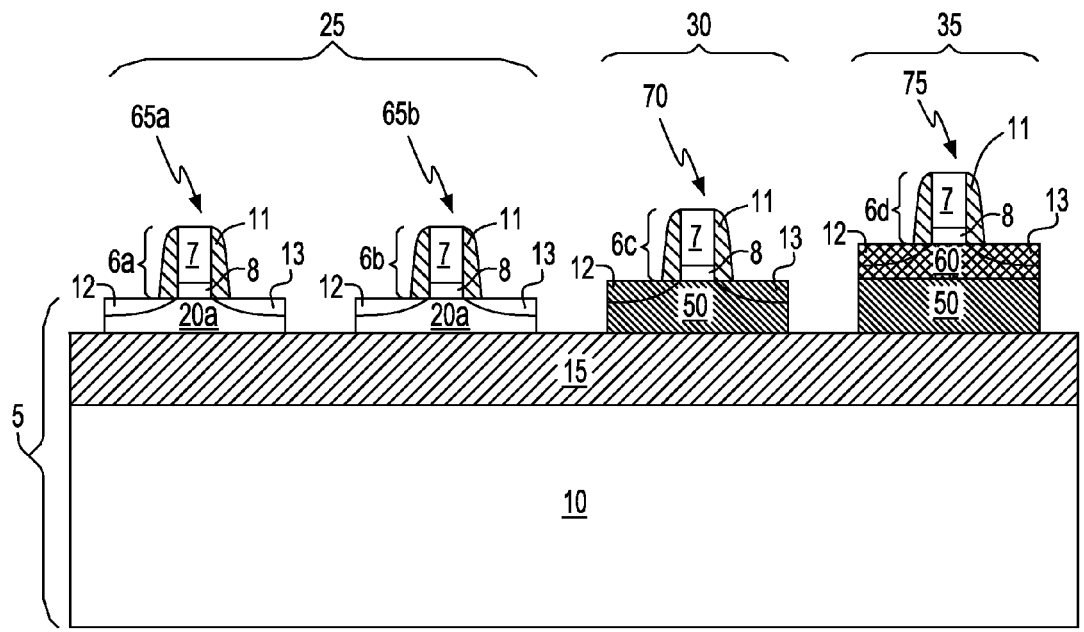
FIG. 8 is a side cross-sectional view depicting forming at least one low power semiconductor device including a first n-type semiconductor device and a first p-type semiconductor device on the silicon layer within the first device region, forming a second p-type semiconductor device on the silicon germanium layer of the second device region, and forming a second n-type semiconductor device on the silicon doped with carbon layer of the third device region, in accordance with one embodiment of the present disclosure.

FIG. 8 depicts one embodiment of forming the gate structure 6a, 6b to the n-type semiconductor device 65a and the p-type semi conductor device 65b of the at least one low power semiconductor device 65a, 65b on the first remaining portion 20a of the silicon layer within the first device region 25, forming a gate structure 6c to the at least one p-type high performance semiconductor device 70 on the single material layer of silicon germanium 50 in the second device region 30, and forming a gate structure 6d of an n-type high performance semiconductor device 75 on the silicon doped with carbon layer (Si:C) 60 of the third device region 35. The pitch separating adjacent gate structures 6a, 6b, 6c may range from 40 nm to 200 nm. The term "pitch" means the center-to-center distance between two repeating gate structures 6a, 6b, 6c of a semiconductor structure. The gate structure 6b within the second device region 30 may be vertically offset and above the gate structure 6a within the first device region 25. The gate structure 6c within the third device region 35 may be vertically offset and above the gate structure 6b within the second device region 30.

The gate structures 6a, 6b, 6c, 6d can be formed using deposition, photolithography and a selective etching process. The gate structures 6a, 6b, 6c, 6d may include at least a gate conductor 7 atop a gate dielectric 8. In one embodiment, the gate conductor 7 may be a metal gate electrode. The metal gate electrode may be any conductive metal including, but not limited to W, Ni, Ti, Mo, Ta, Cu, Pt, Ag, Au, Ru, Ir, Rh, and Re, and alloys that include at least one of the aforementioned conductive elemental metals. In another embodiment, the gate conductor 7 may be a doped semiconductor material, such as a doped silicon containing material, e.g., doped polysilicon. The gate dielectric 8 may be a dielectric material, such as $SiO_2$, or alternatively high-k dielectrics, such as oxides of Hf, Ta, Zr, Al or combinations thereof. In one embodiment, the gate dielectric 9 has a thickness ranging from 1 nm to 10 nm. In another embodiment, the gate dielectric 9 has a thickness ranging from 1.5 nm to 2.5 nm. In one embodiment, the gate structures 6a, 6b, 6c may be formed using replacement gate processes.

A set of spacers 11 can be formed in direct contact with the sidewalls of the gate structures 6a, 6b, 6c, 6d. The spacer 11 can be formed using deposition and etch processing steps. The spacer 11 may be composed of a dielectric, such as nitride, oxide, oxynitride, or a combination thereof.

Figure 9:
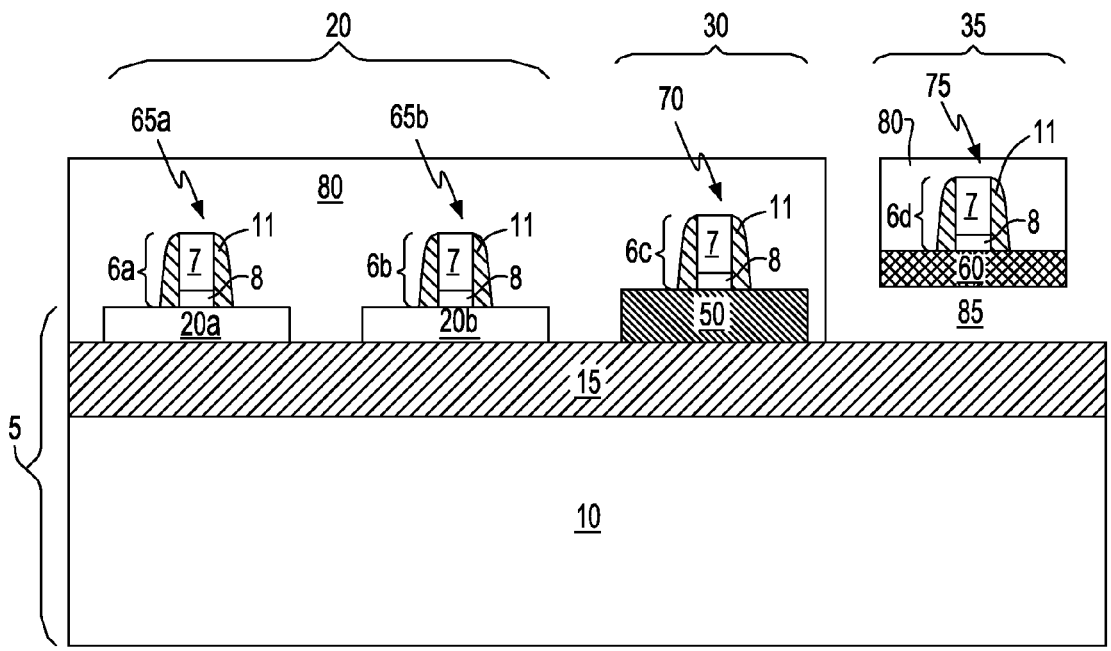
FIG. 9 is a side cross-sectional view depicting removing the silicon germanium layer that is underlying the silicon doped with carbon layer to provide an undercut region between the silicon doped with carbon layer and the buried insulating layer, in accordance with one embodiment of the present disclosure.

FIG. 9 depicts one embodiment of removing the single material layer of the silicon germanium that is underlying the silicon doped with carbon layer 60 to provide an undercut region 85 between the silicon doped with carbon layer 60 and the buried dielectric layer 15. In one embodiment, removing the single material layer of the silicon germanium may begin with forming a supporting dielectric 80 overlying the first device region 25, the second device region 30, and the third device region 35. The supporting dielectric 80 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC, also known as amorphous hydrogenated carbon, α-C:H). The supporting dielectric 80 may be formed by various deposition, including, but not limited to, spinning from solution, spraying from solution, chemical vapor deposition (CVD), plasma enhanced CVD (PECVD), sputter deposition, reactive sputter deposition, ion-beam deposition, and evaporation.

Following deposition, the supporting dielectric 80 may be patterned and etched to provide openings exposing at least the end portions of the single material layer of the silicon germanium 50 that is present underlying the silicon doped with carbon layer 60. The openings to the single material layer of silicon germanium 50 may be formed using an anisotropic etch, such as reactive ion etch (RIE). In some embodiments, the etch process for forming the openings to the single material layer of silicon germanium 50 removes the material of the supporting dielectric 80 selective to the single material layer of silicon germanium 50.

Still referring to FIG. 9, in some embodiments, following the formation of the openings exposing the single material layer of silicon germanium 50, a selective etch process may remove the single material layer of silicon germanium 50 without significantly damaging the silicon doped with carbon layer 60 and the buried dielectric layer 15. In some embodiments, the etch process for removing the single material of silicon germanium 50 is also selective to the supporting dielectric 80. In some embodiments, the etch for removing the single material layer of silicon germanium 50 is an isotropic, i.e., non-directional etch. For example, the etch process for removing the single material layer of silicon germanium 50 may be a dry etch, such as a plasma etch, in which the etch chemistry is composed of hydrochloric acid (HCl). By removing the single material layer of silicon germanium from underneath the silicon doped with carbon layer 60, an undercut region 85 is formed in the third device region 35 of the substrate 5. Although, the silicon doped with carbon layer 60 is depicted as floating in FIG. 9, it is noted that the silicon doped with carbon layer 60 is supported by the gate structure that is formed on top of the silicon doped with carbon 60 layer and its extension is formed on the buried dielectric layer 15.

Figure 10:
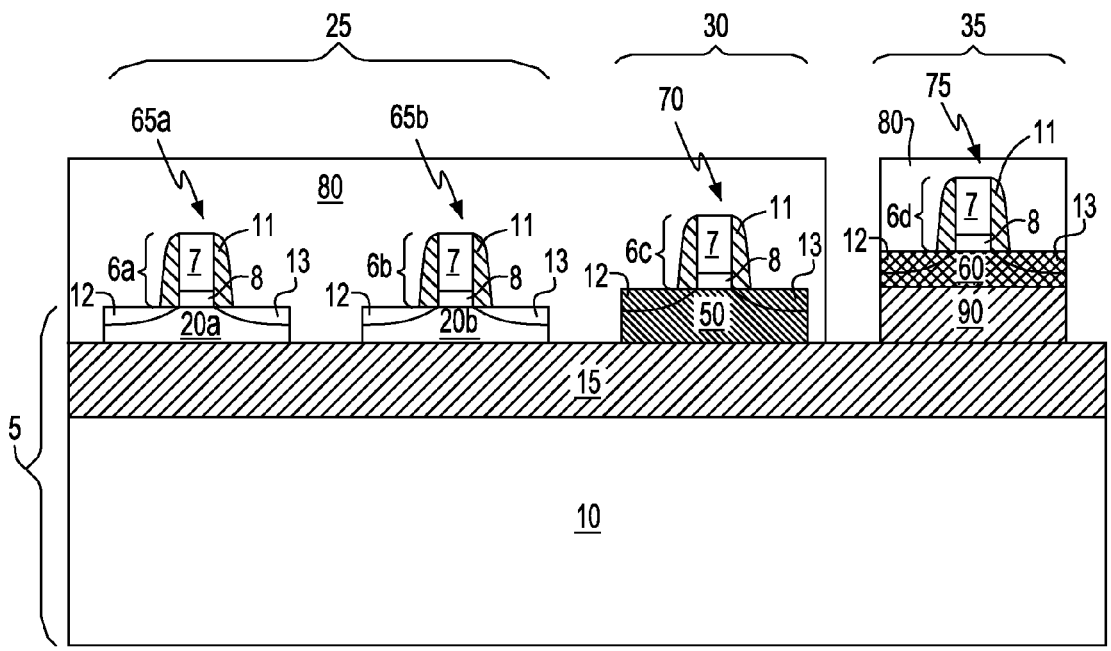
FIG. 10 is a side cross-sectional view depicting filling the undercut region with a dielectric material, in accordance with one embodiment of the present disclosure.

FIG. 10 depicts one embodiment of filling the undercut region with a dielectric fill material 90. The dielectric fill material 90 may be formed by various deposition methods, including, but not limited to, spinning from solution, spraying from solution, chemical vapor deposition (CVD), plasma enhanced CVD (PECVD), sputter deposition, reactive sputter deposition, ion-beam deposition, and evaporation. The dielectric fill material 90 may be composed of any dielectric material including oxides, nitrides or oxynitrides. In some examples, the dielectric fill material 90 may be composed of silicon oxide ($SiO_2$) or silicon nitride. It is noted that the aforementioned materials for the dielectric fill material 90 have been provided for illustrative purposes only, as any dielectric material may be suitable for the dielectric fill material 90. For example, the dielectric fill material 90 may have any composition that is listed for the supporting dielectric 80 described above with reference to FIG. 9. Following formation of the dielectric fill material 90, the supporting dielectric 80 may be removed to expose the first device region 25, second device region 30 and the third device region 35 for further processing.

In one embodiment, a source region 12 and a drain region 13 is formed on opposing sides of the gate structures 6a, 6b, 6c, 6d for each of the n-type semiconductor low power semiconductor device 65a and the n-type semiconductor device 65b of the p-type high performance semiconductor device 70, and the n-type high performance semiconductor device 75. In the embodiment depicted in FIG. 8, the low power semiconductor device is a complementary metal oxide semiconductor (CMOS) device, where in the n-type semiconductor device 65a is provided by an nFET, and the p-type semiconductor device 65b is provided by a pFET In one embodiment, the conductivity type of the semiconductor device dictates the dopant conductivity type of the source regions 12 and the drain regions 13. As used herein, the terms "conductivity type" denote a p-type or n-type doped semiconductor. As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium. As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous. The dopant that provides the source regions 12 and drain regions 13 may be introduced to the semiconductor substrate using ion implantation.

In another embodiment, the source regions 12 and drain regions 13 may be raised source and drain regions. As used herein, the term "raised" in combination with source and/or drain denotes that the source and/or drain region is formed of a semiconductor material layer that is present on an upper surface of the substrate 5 on which the gate dielectric 8 is present. The raised source and drain regions may be composed of an epitaxially formed material that is doped using in-situ doping processes, or is doped by ion implantation.

Still referring to FIG. 10, in one embodiment, a semiconductor device is provided that includes a substrate 5 including a first device region 25 including a silicon layer 20a in direct contact with a buried dielectric layer 15, a second device region 30 including a silicon germanium layer 50 in direct contact with the buried dielectric layer 15, and a third device region 35 with a silicon doped with carbon layer 60. In one embodiment, the silicon layer 20a is comprised of a base material of 100% silicon, the silicon germanium layer 50 comprises a germanium content ranging from 5 wt. % to 30 wt %, and the silicon doped with carbon layer 60 comprises a carbon content ranging from 0.3 wt. % to 2 wt. %.

At least one low power semiconductor device including a first n-type semiconductor device 65a and a first p-type semiconductor device 65b is present on the silicon layer 20a within the first device region 25 of the substrate 5. In one embodiment, the first n-type semiconductor device 65a and the first p-type semiconductor device 65b of the low power semiconductor device are field effective transistors (FET). In one embodiment, the nFET 65a of the low power semiconductor device may have an off current ranging from 0.1 nA/μm to 10 nA/μm. In one embodiment, the first p-type semiconductor device 65b of the low power semiconductor device may have an off current ranging from 0.1 nA/μm to 10 nA/μm. The first n-type semiconductor device 65b, e.g., nFET, of the low power semiconductor device may have a threshold voltage ranging from 0.25 V to 0.45 V. The first p-type semiconductor device 65b, e.g., pFET, of the low power semiconductor device may have a threshold voltage ranging from 0.25 V to 0.45 V.

The high performance p-type semiconductor device 70, e.g., pFET (hereafter referred to as "second p-type semiconductor device 70") that is present in the second device region 30 has a lower threshold voltage than the first p-type semiconductor device 65b of the low power semiconductor device, and has a greater off current than the first p-type semiconductor device 65b of the lower power semiconductor device. In one embodiment, the second p-type semiconductor device 70 may have an off current ranging from 10 nA/μm to 1000 nA/μm. In one embodiment, the second p-type semiconductor device has a threshold voltage ranging from 0.1 V to 0.3 V. The second p-type semiconductor device 70 may have a threshold voltage that is 0.05 V to 0.5 V lower than the first p-type semiconductor device 65b of the low power semiconductor device that is in the first device region 25. In another embodiment, the second p-type semiconductor device 70 may have a threshold voltage that is 0.1 V to 0.4 V lower than the first p-type semiconductor device that is in the first device region. The second p-type semiconductor device 70 may also be characterized as having a higher leakage than the p-type semiconductor device 65b of the low power semiconductor device.

The high performance n-type semiconductor device 75, e.g., nFET, (hereafter referenced to as "second n-type semiconductor device 75") that is present in the third device region 35 has a lower threshold voltage than the first n-type semiconductor device 65a of the low power semiconductor device, and has a greater on current than the first n-type semiconductor device 65a of the lower power semiconductor device. In one embodiment, the high performance n-type semiconductor device 75 may have an off current ranging from 10 nA/μm to 1000 nA/μm. In one embodiment, the second n-type semiconductor device 75 has a threshold voltage ranging from 0.1 V to 0.3 V. The second n-type semiconductor device 75 may have a threshold voltage that is 0.05 V to 0.3 V that is less then the threshold voltage of the first n-type semiconductor device 65a of the low power semiconductor device that is present in the first device region 25. In one embodiment the second n-type semiconductor device 75 may have a threshold voltage that is 0.1 V to 0.2 V that is less than the threshold voltage of the first n-type semiconductor device of the low power semiconductor device that is present in the first device region. The second n-type semiconductor device 75 may also be characterized as having a higher leakage than the first n-type semiconductor device 65a of the low power semiconductor device.

While the structures and methods of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:
1. A semiconductor device comprising:
   a substrate including a first device region including a silicon layer in direct contact with a buried dielectric layer, a second device region including a silicon germanium layer in direct contact with the buried dielectric layer, and a third device region with a silicon-doped-with-carbon layer;
   at least one low power semiconductor device including a first n-type semiconductor device and a first p-type semiconductor device on the silicon layer within the first device region of the substrate;
   a second p-type semiconductor device on the silicon germanium layer of the second device region of the substrate, wherein the second p-type semiconductor device has a threshold voltage that is 0.05 V to 0.5 V less than a threshold voltage of the first p-type semiconductor device of the at least one low power semiconductor device; and
   a second n-type semiconductor device on the silicon-doped-with-carbon layer of the third device region of the substrate, wherein the second n-type semiconductor device has a threshold voltage that is 0.05 V to 0.3 V less than a threshold voltage of the first n-type semiconductor device of the at least one low power semiconductor device.

2. The semiconductor device of claim 1, wherein an off current for at least one of the first n-type semiconductors device and the first p-type semiconductor device of the least one low current semiconductor device is less than 10 nA/μm, and an off current for at least one of the second n-type semiconductor device and the second p-type semiconductor device is greater than 10 nA/μm.

3. The semiconductor device of claim 1, wherein the silicon layer is comprised of base material of 100% silicon, the silicon germanium layer comprises a germanium content ranging from 5 wt. % to 60 wt. %, and the silicon-doped-with-carbon layer comprises a carbon content ranging from 0.2 wt. % to 2 wt. %.

4. The semiconductor device of claim 1, wherein the at least one low power semiconductor device comprises a complementary metal oxide semiconductor device.

5. The semiconductor device of claim 1, where in the threshold voltage for at least one of the first n-type semiconductor and the first p-type semiconductor device is greater the 0.3 V; and the threshold voltage of the second n-type semiconductor device ranges from 0.1 V to 0.3 V, and the threshold voltage of the second p-type semiconductor device ranges from 0.1 V to 0.3 V.

* * * * *